United States Patent [19]

Akaike et al.

[11] Patent Number: 5,769,997
[45] Date of Patent: Jun. 23, 1998

[54] METHOD FOR BONDING AN INSULATOR AND CONDUCTOR

[75] Inventors: Masatake Akaike, Atsugi; Takayuki Yagi, Yokohama; Masahiro Fushimi, Zama; Miki Tamura, Isehara, all of Japan

[73] Assignee: Canon Kabushiki Kaisha, Tokyo, Japan

[21] Appl. No.: 841,381

[22] Filed: Apr. 30, 1997

Related U.S. Application Data

[63] Continuation of Ser. No. 216,446, Mar. 23, 1994, abandoned.

[30] Foreign Application Priority Data

Mar. 23, 1993 [JP] Japan .................................. 5-064294

[51] Int. Cl.⁶ ...................................................... B32B 31/06
[52] U.S. Cl. .............................. 156/273.1; 65/40; 65/43; 156/272.2; 204/164; 205/114
[58] Field of Search ........................ 205/114; 204/157.15, 204/164; 156/272.2, 273.1; 65/40, 43

[56] References Cited

U.S. PATENT DOCUMENTS

| | | | |
|---|---|---|---|
| 3,397,278 | 8/1968 | Pomerantz | 257/650 |
| 3,417,459 | 12/1968 | Pomerantz et al. | 219/118 |
| 3,506,424 | 4/1970 | Pomerantz | 65/40 |
| 3,589,965 | 6/1971 | Wallis et al. | 156/272.2 |
| 3,783,218 | 1/1974 | Adams et al. | 219/765 |
| 4,452,624 | 6/1984 | Wohltjen et al. | 65/40 |
| 4,643,532 | 2/1987 | Kleiman et al. | 350/343 |
| 5,009,690 | 4/1991 | Curlee et al. | 65/40 |

FOREIGN PATENT DOCUMENTS 0539741  5/1993  European Pat. Off. .

OTHER PUBLICATIONS

George Wallis et al, Field Assisted Glass–Metal Sealing, Journal of Applied Physics, vol. 40, No. 10, Sep. 1969, pp. 3946–3949.

Thomas R. Anthony, Anodic bonding of imperfect surfaces, Journal of Applied Physics, vol. 54, No. 5, May 1983, pp. 2419–2428.

*Primary Examiner*—Kathryn L. Gorgos
*Assistant Examiner*—William T. Leader
*Attorney, Agent, or Firm*—Fitzpatrick, Cella, Harper & Scinto

[57] ABSTRACT

Anodic bonding of an insulator containing no movable ion and a conductor through the medium of a conductive film and an insulator layer containing a movable ion affords a bonded member of the insulator containing no movable ion and the conductor without use of any adhesive agent. A method for effecting the anodic bonding is also provided.

16 Claims, 14 Drawing Sheets

METHOD FOR BONDING AN INSULATOR AND CONDUCTOR

This application is a continuation of Application Ser. No. 07/216,446 filed Mar.23, 1994, now abandoned.

BACKGROUND OF THE INVENTION

1. Field of the Invention

This invention relates to a bonded member of an insulator and a conductor to use the piezoelectric effect and a method for bonding.

2. Related Background Art

In recent years, intensive research has been under way with a view to developing such minute machines as are represented by micromachines, particularly microactuators. Piezoelectrically effective ceramics are advantageously used as parts in these micromachines. Piezoelectrically effective ceramics, when bonded to an elastic material such as Si substrates, give rise to such devices as minute ultrasonic oscillators, ultrasonic sensors, and angular velocity sensors. Thus, the technique of bonding ceramics to conductors such as Si substrates is gaining in importance.

Among other known practices adopted for bonding of ceramics and conductors, the adhesion of ceramics to conductors through the medium of an adhesive agent containing a polymer has been much in vogue. The adhesive agent which contains a polymer, however, has the disadvantage that when it is used in a minute device, it tends to exude from a delimited site of adhesion. Because of the incorporation of the polymer therein, this adhesive agent is not heat resistant and cannot withstand the high temperatures experienced in the manufacture of the device using the adhesive agent or in the actual use of the manufactured device. Further, since the process of adhesion inevitably necessitates a step of applying the adhesive agent to a prospective interface, there is difficulty in the fixation of a proper site for application of the adhesive agent.

As means for attaining the bonding of ceramics and conductors without use of an adhesive agent, the method which comprises providing a thin metallic film between a Si substrate and a ceramic and fusing the metallic film at the bonding interface at high temperatures, thereby joining the Si substrate to the ceramic has been known. The ceramic in this case, however, has the possibility of being deprived of the inherent dielectric polarity thereof which fulfills a major role in enabling the ceramic to acquire a piezoelectric effect. Therefore, in this method, it is necessary to regain the dielectric polarity by imposing a strong electric field in the ceramic. This method, however, entails the problem of an addition to the number of component steps of the adhesion process.

SUMMARY OF THE INVENTION

This invention has for its object the provision of a bonded member of an insulator and a conductor without using an adhesive agent or necessitating a high temperature heat treatment and a method for effecting the bonding.

The bonded member of an insulator and a conductor according to this invention is characterized by having an insulator containing no movable ion and a conductor anodically bonded through the medium of a conducting film and an insulator layer containing a movable ion.

A first method for bonding an insulator containing no movable ion and a conductor is characterized by comprising:

(a) a step of polishing the insulator thereby imparting a flat smooth surface thereto, (b) a step of forming a thin conductive film on the flat smooth surface of the insulator, (c) a step of forming a conductive thin film on one end of an insulating substrate containing a movable ion, (d) a step of anodically bonding the insulating substrate to the thin conductive film on the insulator, (e) a step of subsequently thinning and polishing the insulating substrate containing a movable ion thereby imparting a flat smooth surface thereto, and (f) a step of anodically bonding the conductor and the flatly and smoothly polished surface of the insulating substrate.

A second method for bonding an insulator containing no movable ion and a conductor according to this invention is characterized by the steps of forming a conductive film on at least one surface of the insulator and an insulating film on one surface of the conductor, mutually bonding the conductive film on the insulator and the insulating film on the conductor, and irradiating the conductive film on the insulator and the conductor with a light while applying a voltage therebetween.

DETAILED DESCRIPTION OF THE PREFERRED EMBODIMENTS

Figure 1:
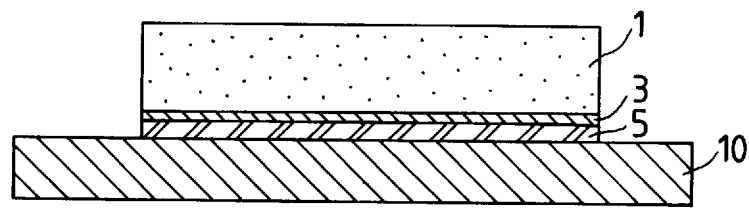
FIG. 1 is a cross section illustrating one example of the bonded member of this invention.
Figure 3:
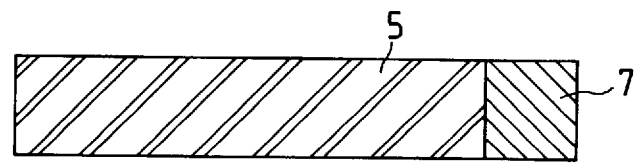
FIG. 3 is a view in the direction of the arrow A in FIG. 2C.

FIG. 1 is a cross section illustrating one example of the bonded member of this invention. The bonded member of this invention, as illustrated in FIG. 1, is a bonded member of an insulator and a conductor which has an insulator containing no movable ion such as PZT (lead zirconate titanate) and a conductor such as Si substrate 10 anodically bonded through a conductive film such as an Al thin film 3 and an insulator layer containing a movable ion such as glass 5.

As concrete examples of the insulator containing no movable ion, such piezoelectric materials as PZT, barium titanate oxide, strontium titanate oxide, zinc oxide, and crystal may be cited. As concrete examples of the insulator layer containing a movable ion, Si oxide film, Al oxide film, Ti oxide film, Zr oxide film, Zn oxide film, Pb oxide film, Cu oxide film, Sn oxide film, and glass may be cited. Then as concrete examples of the conductive film, Si, Al, Ti, Zn, Zr, Pb, Cu, Sn, and C may be cited.

For the sake of obtaining the bonded member of this invention, it is essential that a conductive thin film such as Al should be formed in advance on the surface of such an insulator as PZT. In this case, since the insulator such as a ceramic is formed of a sintered material having a porous texture and contains countless micropores on the surface and the interior of the insulator, the surface of the insulator should be ground flatly and smoothly and then covered with a conductive film. Meanwhile, such a conductor as a Si substrate and an insulator layer such as a Pyrex glass #7740 (Pyrex is a trade name of Corning) substrate in the shape of a thin plate are anodically bonded under light irradiation. Then, the conductive film formed on the insulator containing no movable ion and the insulator layer containing a movable ion are anodically bonded under light irradiation to obtain the bonded member of this invention.

In this case, the anodic bonding is firmly produced when the surface roughness of the insulator layer containing no such movable ion, such as PZT is 500 Å or less.

For the purpose of producing firm anodic bonding, the thickness of the insulator layer such as glass is desired to be not more than 0.5 mm and the proportion of the void parts formed in the recessions of the bonding surface of the insulator layer 1 to the whole bonding surface to be not more than 30%.

These delimitations may be logically explained as follows.

Specifically, when this anodic bonding is effected by keeping the insulator and the conductor in a state of intimate mutual contact and, in the meantime, applying an electric field between the insulator as a negative electrode and the conductor as a positive pole, electrostatic attraction occurs in the bonding interface between the insulator and the conductor because the movable ion (cation) in the insulator migrates toward the negative electrode. Owing to this electrostatic attraction, the gap of interface between the insulator and the conductor mutually approach up to an interatomic distance and eventually bond to each other. The bonding surfaces neither approach mutually to the interatomic distance nor give rise to solid-phase bonding when the surface roughness of the insulator such as PZT is large and when the void parts formed in the recesses of the surface account for more than 30% of the whole surface.

According to this invention, a bonded member of an insulator containing no movable ion and a conductor can be obtained without use of an adhesive agent by effecting the anodic bonding through the medium of a conductive film and an insulator layer containing a movable ion. The bonded member thus produced, is usable as a minute material in a minute machine.

In the bonding of a conductor such as a Si substrate to an insulator containing no such movable ion as PZT, the anodic bonding of the conductor and the insulator can be accomplished at a low voltage without use of heating means and without reference to the size and thickness of the insulator PZT by forming a conducting thin film on the surface of the insulator, anodically bonding such an insulator as glass which contains a movable ion and the conducting thin film under light irradiation, then thinning the insulator containing a movable ion such as glass by lapping, and further anodically bonding the thinned insulator and the Si substrate as the conductor under light irradiation. This method of anodic bonding, therefore, is effectively utilized for the mutual bonding of materials of different kinds having different thermal expansion coefficients. Further, the bonding of an insulator material containing no movable ion to such a conductor as a Si substrate can be easily attained at room temperature without use of a heater by adopting a procedure which comprises forming an oxide film and a conductive film respectively on the surfaces of the conductive substrate and the insulator, then applying a voltage between the substrate and the film formed thereon under light irradiation to enhance the force of fixation between the substrate and the film formed thereon, and thereafter further applying a voltage in the state that the films on the conductive substrate and the insulator substrate are superposed so as to be opposite to each other under light irradiation. Examples:

Now, this invention will be described more specifically below with reference to working examples.

Example 1

FIGS. 2A to 2E and FIG. 3 illustrate a first example of this invention; FIGS. 2A to 2E being cross sections which depict the characteristics of this invention to the best advantage and FIG. 3 being a view taken in the direction of the arrow A in FIG. 2C. In these diagrams, 1 stands for a bulk of PZT, 3 and 4 stand for Al thin films formed one each on the opposite surfaces of PZT 1 obtained by polishing one surface of PZT 1 by lapping, 5 stands for a sheet of Pyrex glass #7740 (Pyrex is a trade name of Corning), 7 for an Al thin film formed on one end of one surface of the sheet of Pyrex® glass #7740 5 and adapted for use as an electrode, 9 for a Si substrate mounted on the sheet of Pyrex® glass #7740 5 and adapted to operate as an electrode, 10 for a Si substrate, 11 and 12 stand for platens, 13 stands for a $CO_2$ laser beam adapted to effect anodic bonding under light irradiation, 14 for a DC power source to be used for anodic bonding, 15 for a needle electrode electrically connected to the sheet of Pyrex glass #7740 5 through either the Si substrate 9 or the Al thin film 7 as an electrode, 16 for a needle electrode electrically connected to the Al thin film 3 as an electrode or the Si substrate 10, and 17 for a lead for electrically interconnecting the DC power source 14 to the needle electrodes 15, 16.

Figure 2A:
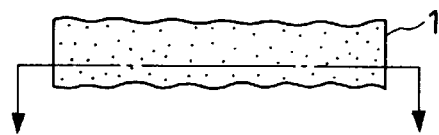
FIGS. 2A to 2E are cross sections illustrating a process of adhesion as a first embodiment of this invention.
Figure 2B:
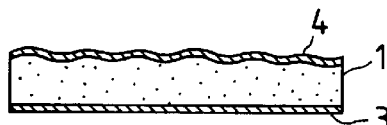
Figure 2C:
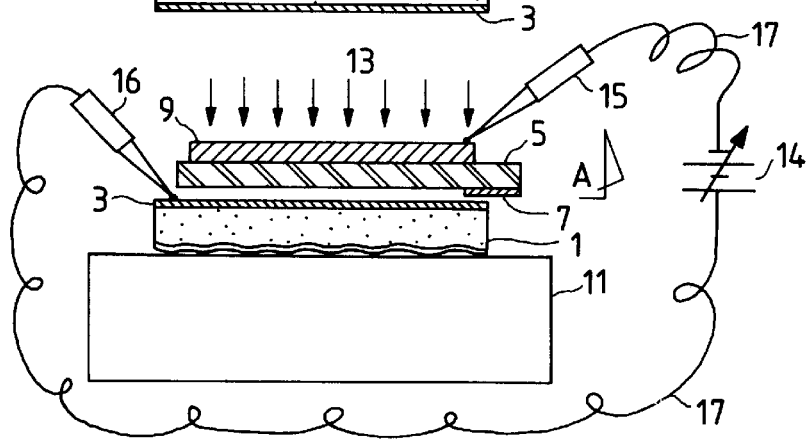

In the construction described above, the $CO_2$ laser beam 13 was projected on the sheet of Pyrex glass #7740 5 through the Si substrate 9 and, in the meantime, an electric field was applied between the Al thin film 3 and the sheet of Pyrex glass #7740 5 by the use of the DC power source as shown in FIG. 2C. In this operation, the intensity of the $CO_2$ laser beam 13 was about 4 W, the dimensions of the sheet of Pyrex glass #7740 were 8 mm×13 mm×0.1 mm (thickness), the dimensions of PZT 1 were 7 mm×13 mm×0.3 mm (thickness), the thickness of the Al thin film 3 was about 3,000 Å, the thickness of the Al thin film 7 was about 1,500 Å, the thickness of the Si substrate 9 was about 0.2 mm, and the voltage of the DC power source 14 was 300 V, and the duration of bonding was 10 minutes.

Figure 2D:
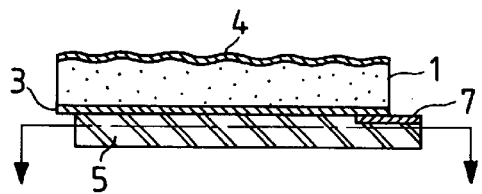
Figure 2E:
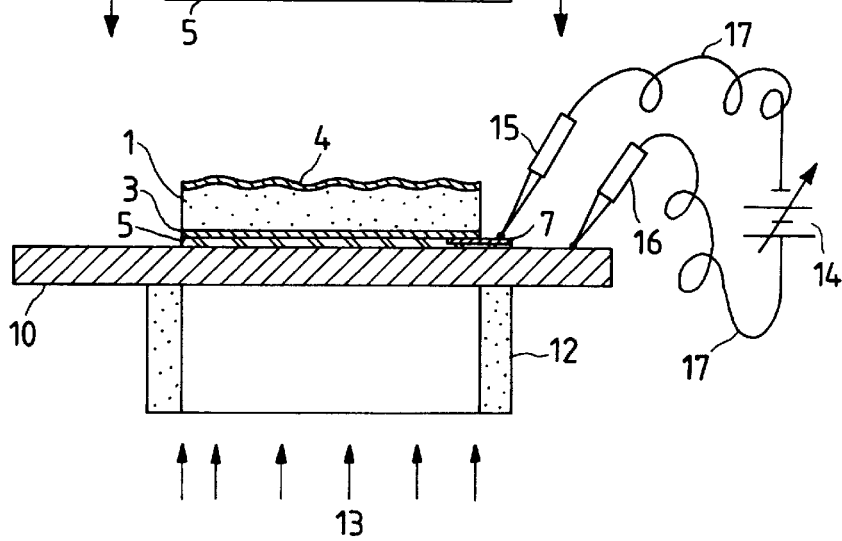

After the sheet of Pyrex glass #7740 5 had been joined by bonding to the PZT 1 through the medium of the Al thin film 3, the sheet of Pyrex glass #7740 (Pyrex is a trade name of Corning) was thinned by lapping polishing to about 40 $\mu$m as shown in FIG. 2D and then a rectangle 4 mm in width and 11 mm in length was cut from the thinned sheet of Pyrex glass #7740 by use of a disco cutter as shown in FIG. 2E. Thereafter, the sheet of Pyrex glass #7740 were anodically bonded to the Si substrate 10 under light irradiation as illustrated in FIG. 2E.

Specifically, the $CO_2$ laser beam 13 was projected from the Si substrate 10 side and, at the same time, an electric field was applied between the sheet of Pyrex glass #7740 5 and the Si substrate 10 through the medium of the Al thin film 7 by the use of the DC power source 14. In this operation, the voltage of the DC power source 14 was 300 V, the intensity of the $CO_2$ laser beam was 5 W, the dimensions of the Si substrate 10 were 38 mm×10 mm×0.52 mm (thickness), and the duration of bonding was 10 minutes.

In the procedure described above, when the AC voltage was applied between the opposite surfaces of the PZT 1 after the bonding of the PZT to the Si substrate, the Si substrate 10 was observed to oscillate at an amplitude of about 1 $\mu$m at not less than 1 kHz and a voltage of 5 V. When the voltage applied was gradually increased to 30 V at the same frequency, the amplitude of the oscillation was observed to increase one-dimensionally in proportion as the voltage was increased.

When PZT was bonded to the oscillator of an oscillation gyro by the procedure described above, desired mechanical strength was obtained quickly at a prescribed site in highly accurate alignment.

This example represents a case of effecting bonding between PZT and a Si substrate. Naturally, this procedure of bonding can be used for bonding other ceramics to conductors.

This bonded member has a cross-sectional construction having the ceramic PZT 1 and the Si substrate 10 bonded through the medium of the glass sheet 5 as shown in FIG. 1. In the diagram, 3 stands for an Al thin film.

Example 2

Figure 5:
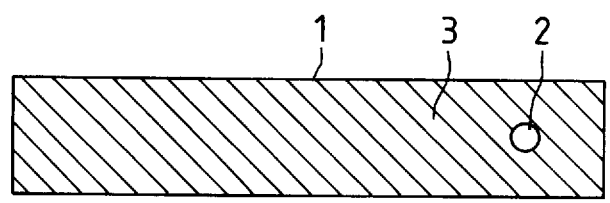
FIG. 5 is a view in the direction of the arrow B in FIG. 4B.
Figure 6:
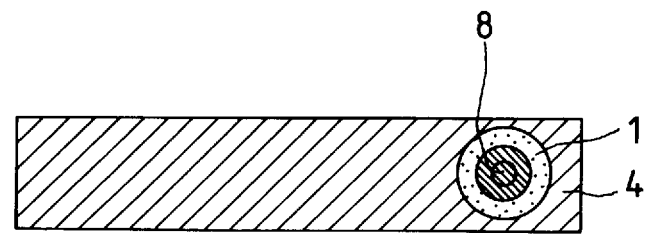
FIG. 6 is a view in the direction of the arrow C in FIG. 4D.
Figure 4A:
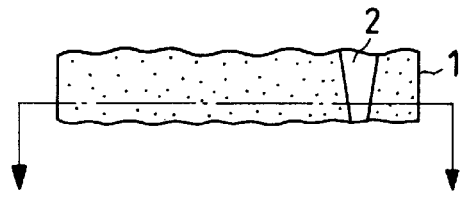
FIGS. 4A to 4E are cross sections illustrating a process of adhesion as a second embodiment of this invention.
Figure 4B:
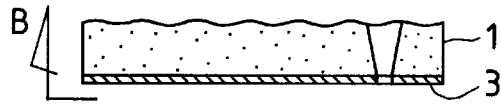

FIGS. 4A to 4E, FIG. 5, and FIG. 6 illustrate a second example of this invention; FIGS. 4A to 4E cross sections depicting the characteristics of this invention to the best advantage, FIG. 5 shows a view taken in the direction of the arrow B in FIG. 4B, and FIG. 6 shows a view taken in the direction of the arrow C in FIG. 4D. In these diagrams, 1 stands for a bulk of PZT, 2 for a hole bored through the bulk of PZT 1, 3 for an Al thin film formed on one surface of the bulk of PZT 1 polished preparatorily by lapping, 4 for an Al thin film formed on the other surface of the bulk of PZT 1, 5 for a sheet of Pyrex glass, 8 for an Al thin film formed inside the hole 2 from the PZT bulk 1 side after the bulk of PZT 1 in the state illustrated in FIG. 4B and the sheet of Pyrex glass #7740 (Pyrex is a trade name of Corning) 5 had been bonded through the medium of the Al thin film 3, 9 for a Si substrate mounted on the sheet of Pyrex glass #7740 (Pyrex is a trade name of Corning) 5, 10 for a Si substrate, 11 and 12 stand for platens, 13 stands for a $CO_2$ laser beam to be used for anodic bonding under light irradiation, 14 for a power source to be used for anodic bonding, 15 for a needle electrode electrically connected to the sheet of Pyrex glass #7740 5 through the Si substrate 9 or to the sheet of Pyrex glass #7740 5 through the Al thin film 8, 16 for a needle electrode connected to the Al thin film 3 on one surface of the bulk of PZT 1 on the platen 11 or to the Si substrate 10 on the platen 12, and 17 for a lead for electrically interconnecting the DC power source 14 to the needle electrodes 15, 16.

Figure 4C:
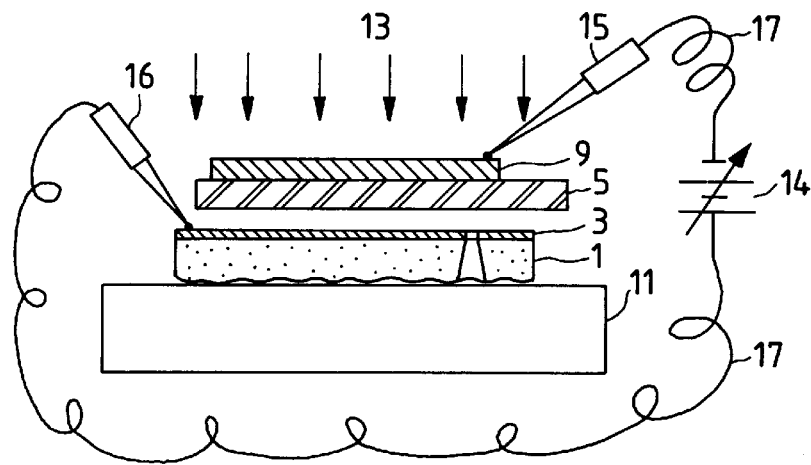
Figure 4D:
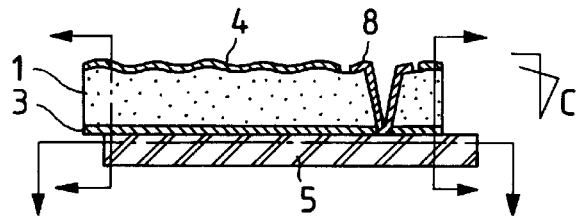
Figure 4E:
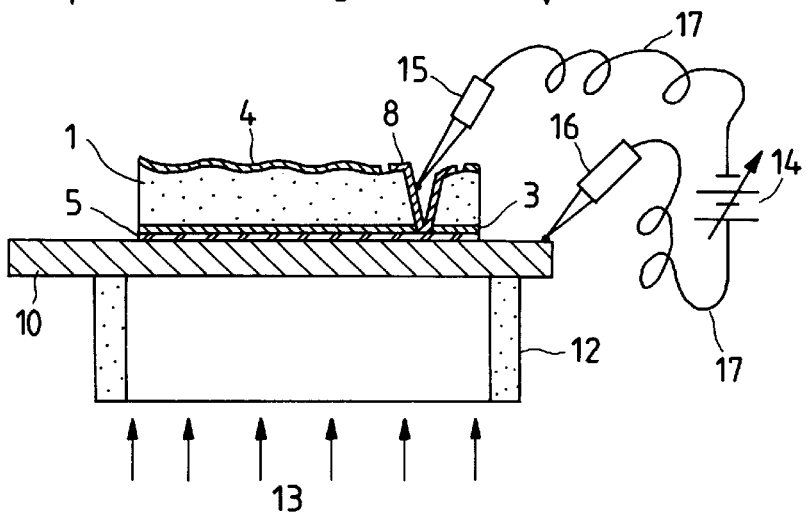
Figure 7A:
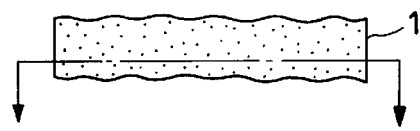
FIGS. 7A to 7D are cross sections illustrating a process of adhesion as a third embodiment of this invention.
Figure 7B:
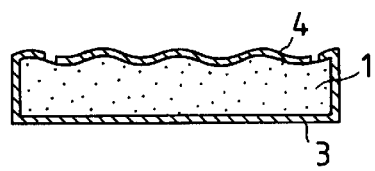
Figure 7C:
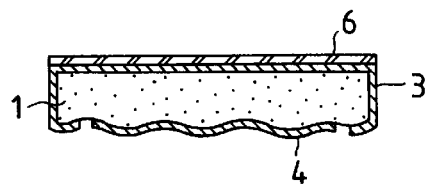
Figure 7D:
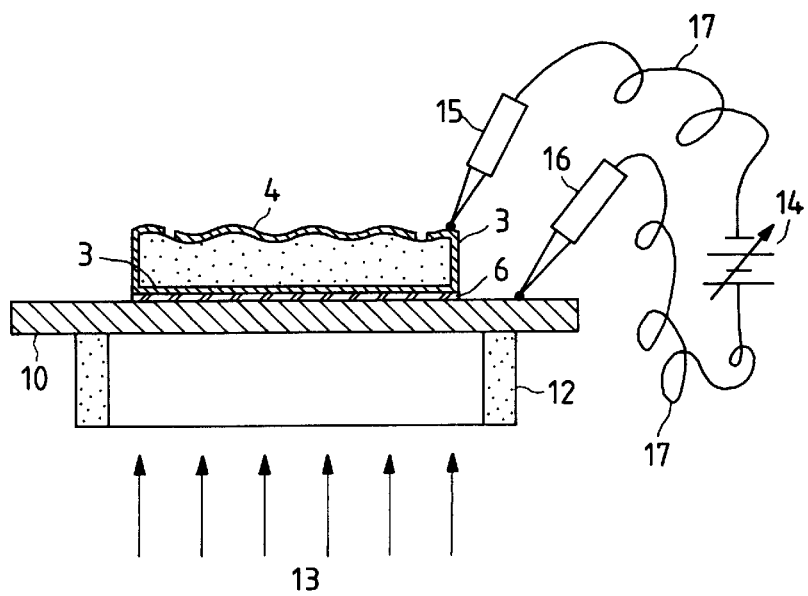
Figure 8:
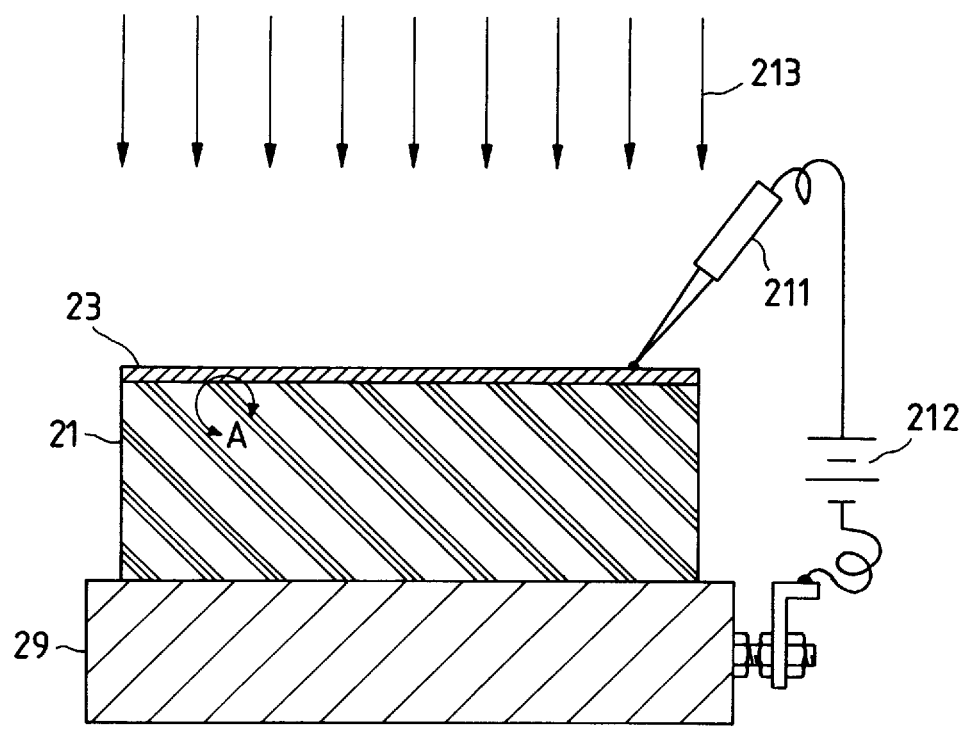
FIG. 8 is a schematic diagram illustrating a method for adhesion as a fourth embodiment of this invention to be employed for enhancing the force of fixation between a PZT substrate and a Si film formed on the PZT substrate.

Now, in the construction described above, the hole 2 was bored in the bulk of PZT 1 by the use of an ultrasonic machine as shown in FIG. 4A, then the part indicated by arrows was polished by lapping, and the Al thin film 3 was formed on the polished surface [FIG. 4B]. To the Al thin film 3 formed on the bulk of PZT 1, the sheet of Pyrex glass #7740 5 having a thickness of 0.1 mm was bonded by anodic bonding as shown in FIG. 4C. To be specific, this bonding was carried out by superposing the Si substrate 9 of a small thickness of about 0.2 mm as a flat electrode on the sheet of Pyrex glass #7740 5 for the purpose of exalting transmissivity to the $CO_2$ laser beam 13, electrically connecting the needle electrode 16 and the needle electrode 15 respectively to the Al thin film 3 and the Si substrate 9, and then applying an electric field between the Al thin film 3 as a positive electrode and the sheet of Pyrex glass #7740 5 as a negative electrode and, in the meanwhile, projecting the $CO_2$ laser light from above the Si substrate 9. Thereafter, the parts pointed by the arrows as shown in FIG. 4D were cut with a disco cutter and subsequently the part of the surface of the sheet of Pyrex glass #7740 5 pointed to by the arrows was polished by lapping until the thickness of the sheet of Pyrex glass #7740 decreased to about 40 $\mu$m. Then, the PZT 1 and the Si substrate 10 were anodically bonded under light irradiation through the medium of the Al thin film 3 and the sheet of Pyrex glass #7740 5 as shown in FIG. 4E. Specifically, this bonding was carried out by projecting the $CO_2$ laser beam 13 from the Si substrate 10 side and, in the meantime, electrically connecting the needle electrode 15 and the needle electrode 16 respectively to the Al thin film 8 and the Si substrate 10, and applying an electric field between the Si substrate 10 as a positive electrode and the sheet of Pyrex glass #7740 5 as a negative electrode by the use of the DC electric power 14. By the formation of the Al thin film 8, the Al thin film 8 and the Al thin film 3 contact each other. As a result, the bonding between the sheet of Pyrex glass #7740 5 and the Si substrate 10 can be facilitated.

In this example, the intensity of the $CO_2$ laser was 5 W, the initial dimensions of the bulk of PZT 1 (FIG. 4A) were 13 mm×7 mm×0.3 mm, the voltage of the DC power source 14 [during the adhesion of FIG. 4C] was 300 V, the dimensions of the PZT cut off with the disco cutter [in the shape illustrated in FIG. 4E] were 10 mm ×4 mm×0.3 mm, and the voltage of the DC power source 14 used for the bonding of FIG. 4E was 50 V.

When the AC voltage was applied between the opposite surfaces of the PZT 1, namely between the Al thin film 4 and the Al thin film 8, after the PZT 1 had been bonded to the Si substrate 10 by the procedure described above, the Si substrate 10 was observed to oscillate at an amplitude of about 1 $\mu$m at not less than 1 kHz and 5 V. When the voltage applied was gradually increased at the same frequency up to 30 V, the amplitude of the oscillation was observed to increase linearly in proportion as the voltage was increased.

When PZT was bonded to the oscillator of an oscillation gyro by the procedure described above at a prescribed site in highly accurate alignment, desired mechanical strength was obtained quickly.

This example represents a case of effecting mounted on the sheet of Pyrex glass #7740 5 and adapted to operate as an electrode. Naturally, this procedure of adhesion can be likewise utilized for bonding a ceramic to a conductor.

Example 3

FIGS. 7A to 7D represent a third example of this invention and are cross sections depicting the characteristics of this invention to the best advantage. In the diagram, 1 stands for a bulk of PZT, 3 and 4 stand for Al thin films formed on the opposite surfaces of PZT 1 obtained by polishing one surface of the bulk of PZT 1, here as seeing FIG. 7B separating the Al thin film 4 on one unpolished surface from the Al thin film 3 at two opposite end parts on the unpolished surface of the layer of PZT 1, 6 stands for a glass film formed by sputtering Pyrex® glass 5 on the Al thin film 3, 10 for a Si substrate, 12 for a platen, 13 for a $CO_2$ laser beam to be used for anodic bonding under light irradiation, 14 for a DC power source to be used for anodic bonding, 15 for a needle electrode electrically connected to the Al thin film 3, 16 for a needle electrode electrically connected to the Si substrate 10, and 17 for a lead for electrically interconnecting the DC power source 14 and the needle electrodes 15, 16.

In the construction described above as shown in FIG. 7D, the $CO_2$ laser beam 13 was projected on the glass film 6 through the Si substrate 10 and, in the meantime, an electric field was applied between the Al thin film 3 and the Si substrate 10 by the use of the DC power source 14. In this operation, the intensity of the $CO_2$ laser beam was about 4 W, the dimensions of the glass film were 7 mm×13 mm×2 mm (thickness), the dimensions of PZT 1 were 7 mm×13 mm×0.3 mm (thickness), the thickness of the Al thin film 3 was about 3,000 Å, the thickness of the Al thin film 4 was about 3,000 Å, the thickness of the Si substrate was about 0.5 mm, the voltage of the DC power source 14 was 10 V, and the duration of bonding was 10 minutes.

When the AC voltage was applied between the opposite surfaces of PZT 1, namely between the Al thin films 3 and 4 after PZT had been bonded to the Si substrate by the procedure mentioned above, the Si substrate 10 was observed to oscillate at an amplitude of about 1 μm by an input of not less than 1 kHz and 5 V. When the voltage so applied was gradually increased at the same frequency up to 30 V, the amplitude of the oscillation was observed to increase linearly in proportion as the voltage was increased.

When PZT was bonded to the oscillator of an oscillation gyro by the procedure described above at a prescribed site in highly accurate alignment, desired mechanical strength was obtained quickly.

The present example represents a case of forming a glass film by the spattering technique. Naturally, the glass film may be obtained otherwise by the CVD method or the alkoxide method.

When a ceramic of a small size is joined by bonding to a Si substrate, it is more desirable to have a glass layer attached to or formed on the ceramic side. Conversely when a Si substrate of a small size is joined by bonded to a ceramic substrate, it is more desirable to have a glass layer attached to or formed on the Si substrate side.

Example 4

FIGS. 8, 9, 10, 11, 12, 13, 14, and 15 represent; a fourth example of this invention. They depict the characteristics of this invention to the best advantage. In these diagrams, 21 stands for a piezoelectric layer of PZT, 22 for oxygen ions forming PZT 21, 23 for a Si film formed on the PZT 21, 24 for Si atom of the Si film 23, 25 for a Si substrate, 26 for Si atoms of the Si substrate 25, 27 for a Si oxide film formed on the Si substrate 25, 28 for oxygen ions of the Si oxide film 27, 29 for a platen of conductive material for mounting a material for bonding 210 and 211 stand for needle electrodes to be used for application of a voltage to materials for bonding, 212 stands for a power source to be used for application of electric field between the materials for bonding and 213 for a $CO_2$ laser beam to be used for projection of light on the surfaces for bonding.

Figure 9:
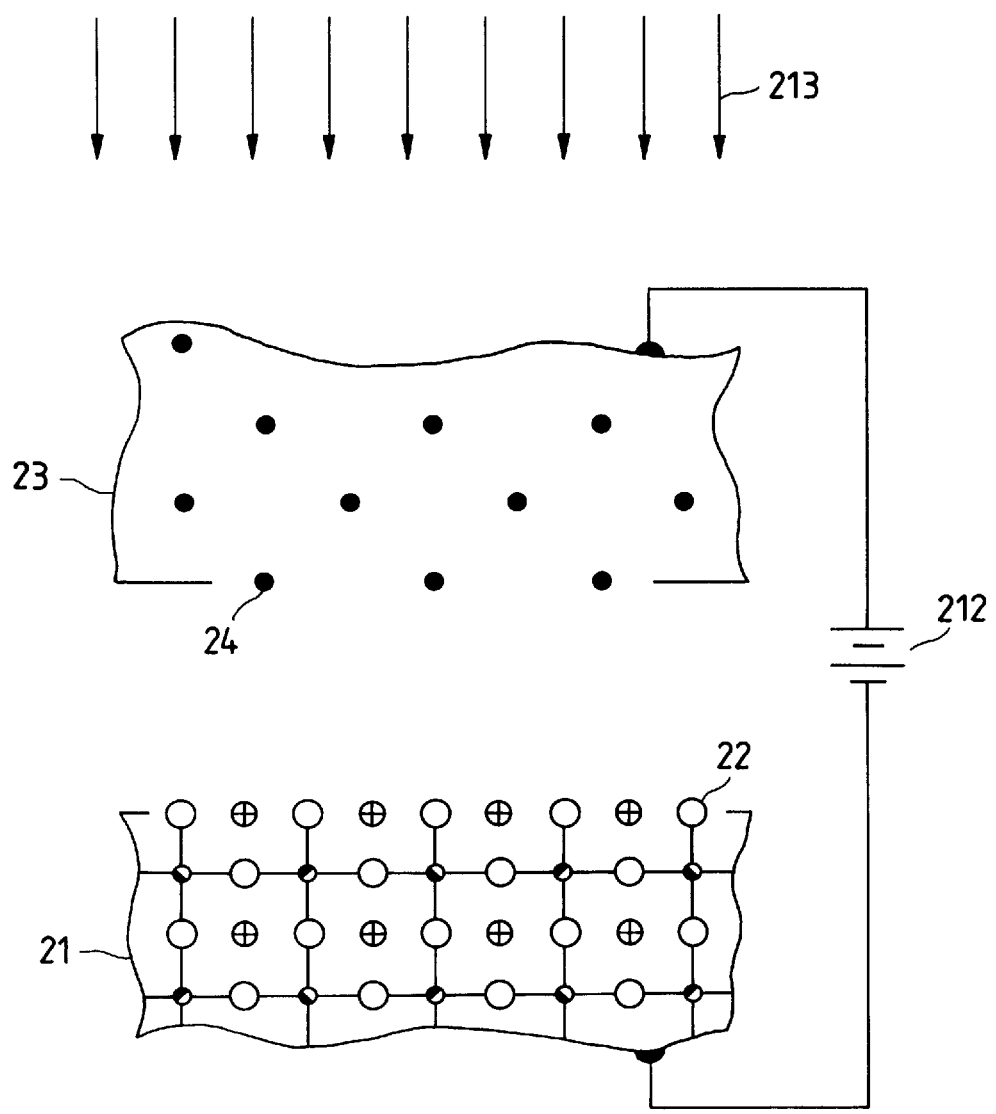
FIG. 9 is a magnified view of the part A shown in FIG. 8.
Figure 10:
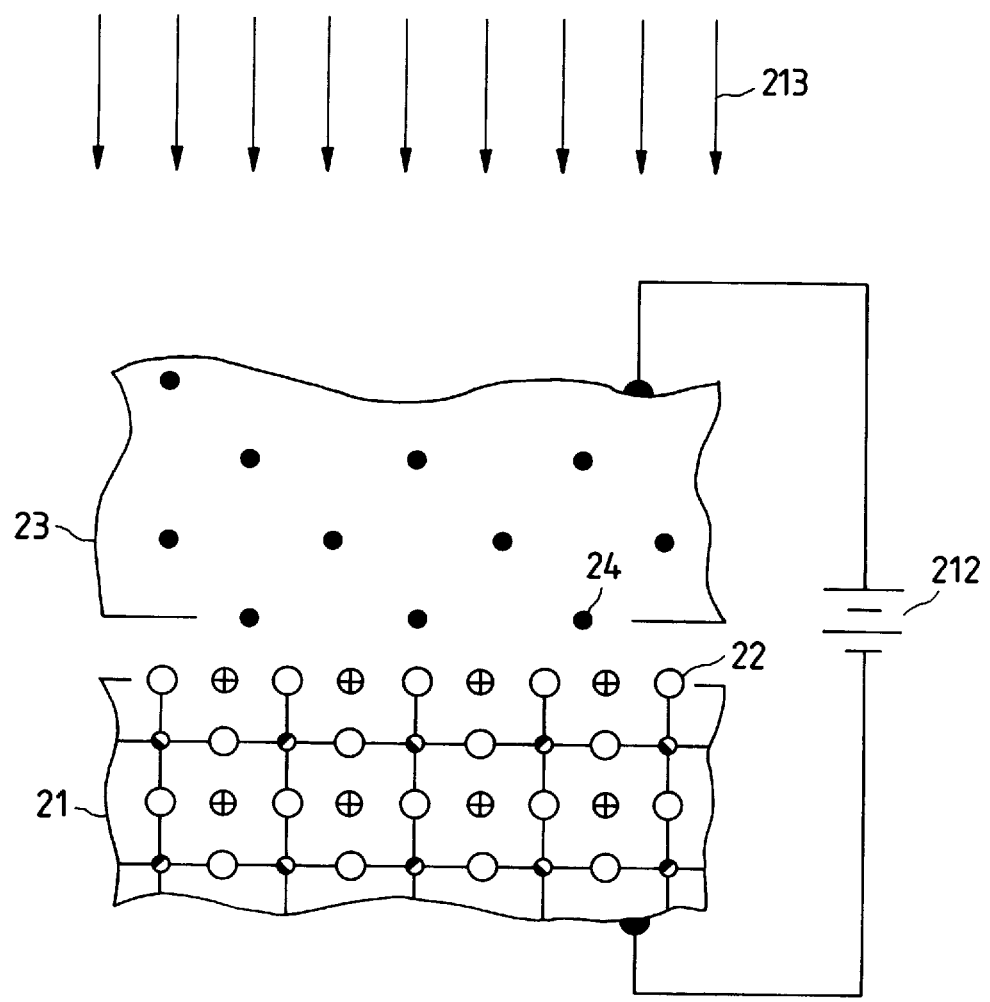
FIG. 10 is a magnified view of the part A shown in FIG. 8.
Figure 11:
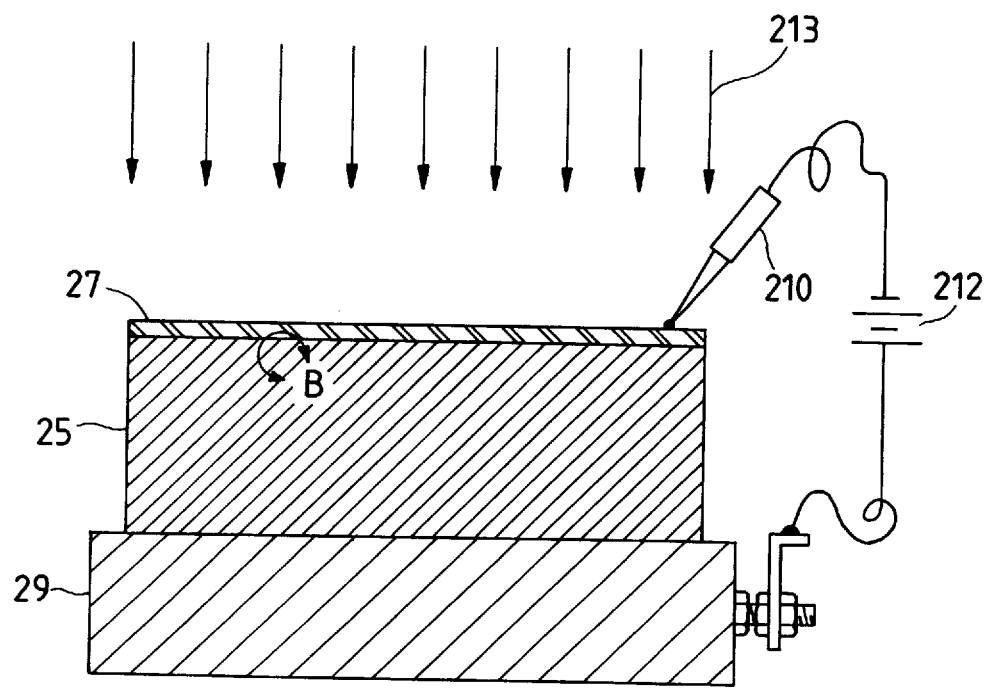
FIG. 11 is a schematic diagram illustrating a method for adhesion between a Si substrate and a Si oxide film formed on the Si substrate.

Then, in the construction described above, a voltage was applied between the Si film 23 and the PZT 21 and, at the same time, the $CO_2$ laser was projected on the surface of the Si film 23 for the purpose of exalting the force of fixation between the PZT 21 and the Si film 23 formed on the surface of PZT 21. According to this procedure, even when the film formed had sustained separation by some cause such as, for example, thermal strain, namely when the distance between the layer of PZT 21 and the Si film 23 was larger than the interatomic distance as shown in FIG. 9, and specifically when no bond was formed or bond of very weak force was formed between the oxygen ions 22 of PZT 21 and the Si atoms 24 of the Si film 23, the distance between the oxygen ions 22 of the PZT 21 and the Si atoms 24 of the Si film 23 was caused by the electrostatic attraction to approach the order of the interatomic distance as shown in FIG. 10. When the $CO_2$ laser beam was projected on the surface of adhesion as shown in FIG. 10, the oxygen ions 22 of the PZT 31 and the Si atoms 24 of the Si film 23 were both excited owing to this excitation, the oxygen ions 22 of the PZT 31 and the Si atoms 24 of the Si film 23 were rendered easily bondable to each other and were eventually bonded to each other after the distance therebetween approached the order of the interatomic distance as shown in FIG. 10. Thus, the force of fixation to be consequently generated between the PZT 21 and the Si film 23 was larger than that which would be obtained by simply forming the Si film 23 on the PZT 21.

Figure 12:
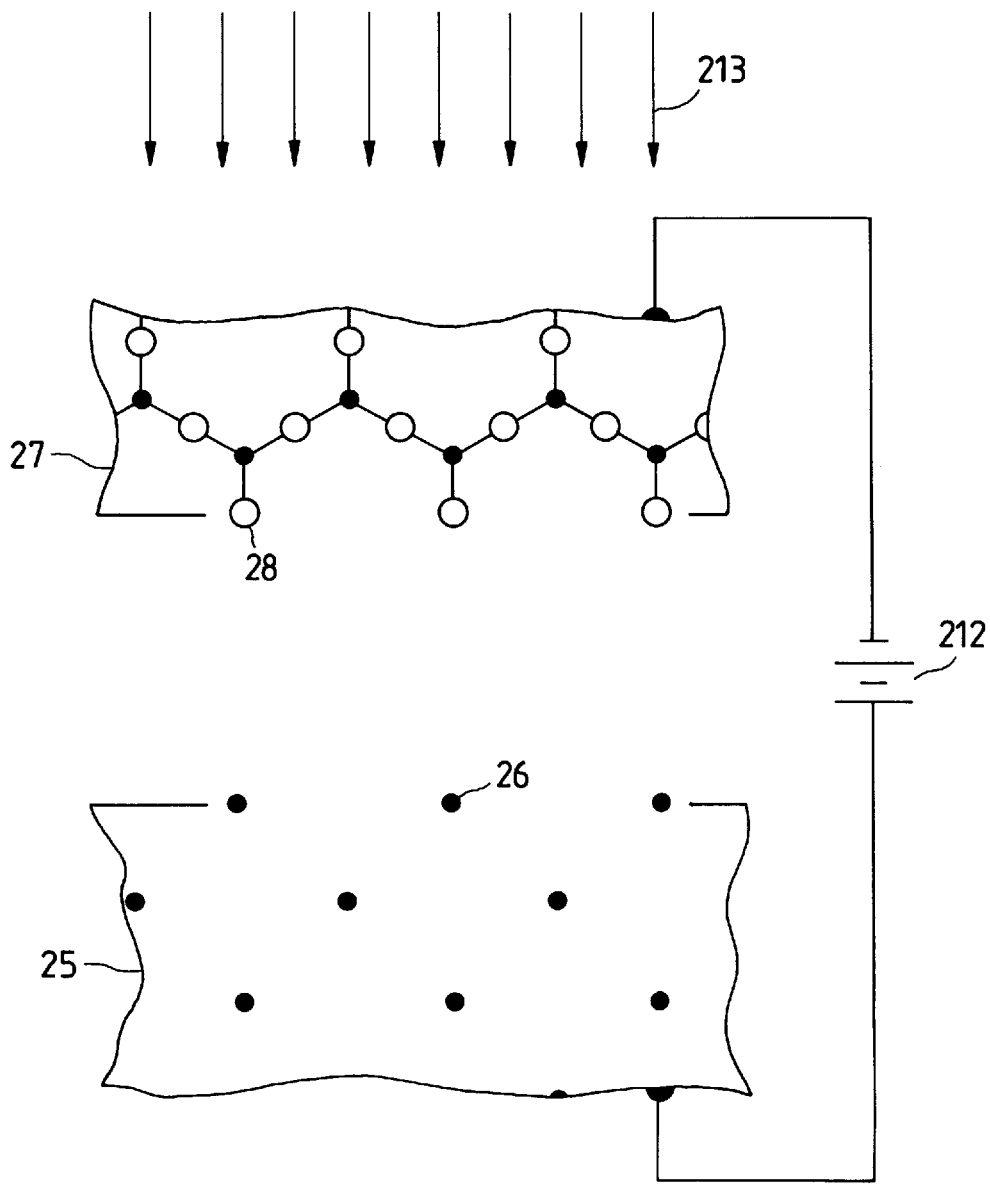
FIG. 12 is a magnified view of the part B shown in FIG. 11.
Figure 13:
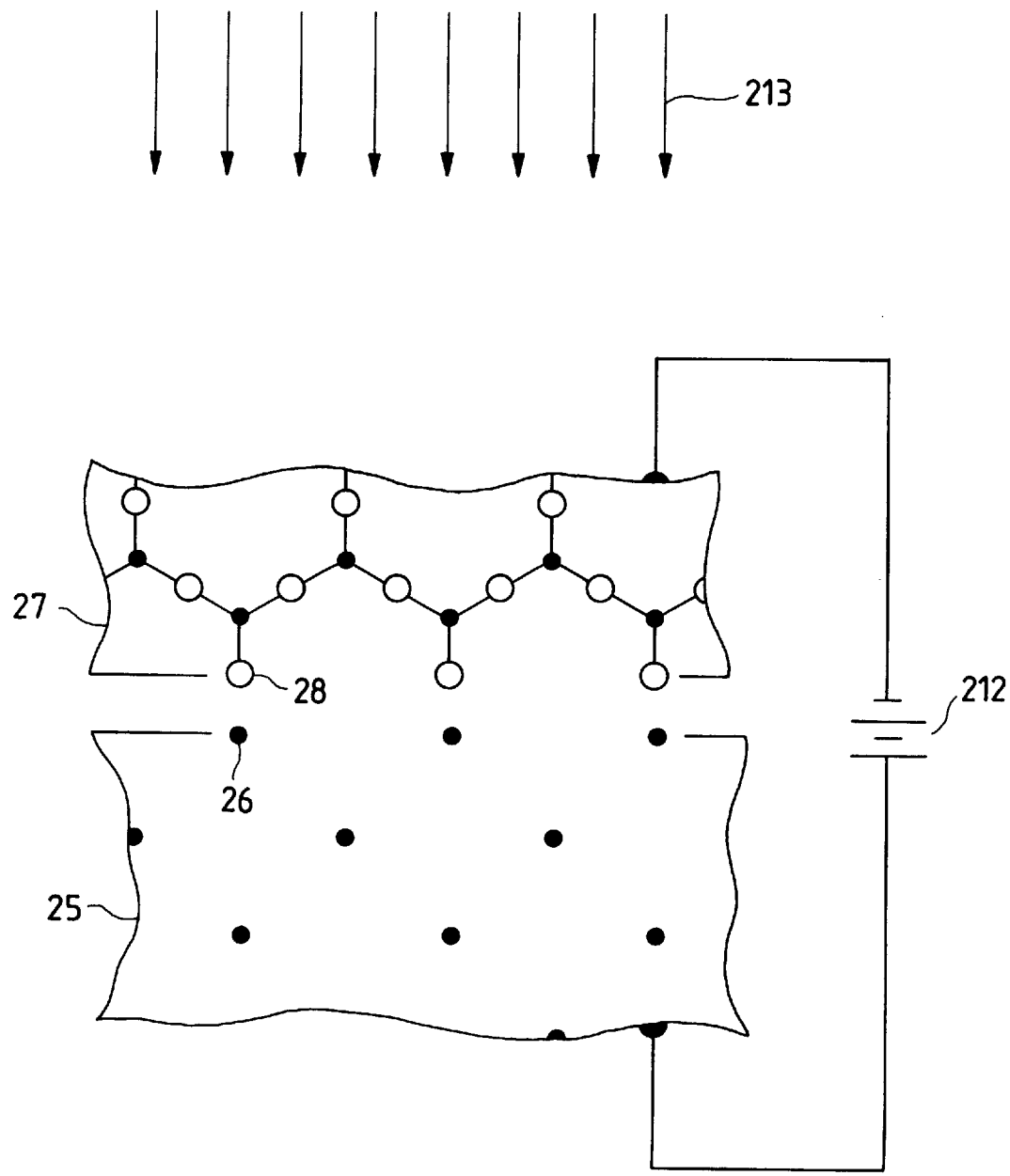
FIG. 13 is a magnified view of the part B shown in FIG. 11.

Then, for the sake of exalting the force of fixation between the Si substrate 25 and the Si oxide film 27 formed on the Si substrate 25, a voltage was applied in the same manner as described above between the Si substrate 25 and the Si oxide film 27 and, at the same time, the $CO_2$ laser was projected on the surface of the Si oxide film. According to this procedure, when the film formed had sustained separation by some cause such as, for example, thermal strain, specifically when no bond was formed between the Si atoms 26 of the Si substrate 25 and the oxygen ions 28 of the Si oxide film 27 because of an unduly wide separation of the Si substrate 25 from the Si oxide film 27 by a gap exceeding the interatomic distance as shown in FIG. 12, the distance between the Si atoms 26 of the Si substrate 25 and the oxygen ions 28 of the Si oxide film 27 was enabled by the electrostatic attraction to approach the order of the interatomic distance as shown in FIG. 13. Further, when the $CO_2$ laser beam was projected on bonding interface as shown in FIG. 13, the Si atoms 26 of the Si substrate 25 and the oxygen ions 28 of the Si oxide film 27 were both excited by this irradiation, the Si atoms 26 and the oxygen ions 28 were rendered easily bondable to each other and were eventually bonded to each other after the distance therebetween had closed to interatomic distance. Thus, the force of fixation generated between the Si substrate 25 and the Si oxide film 27 was greater than that which would be obtained simply by forming the film on the substrate.

Figure 14:
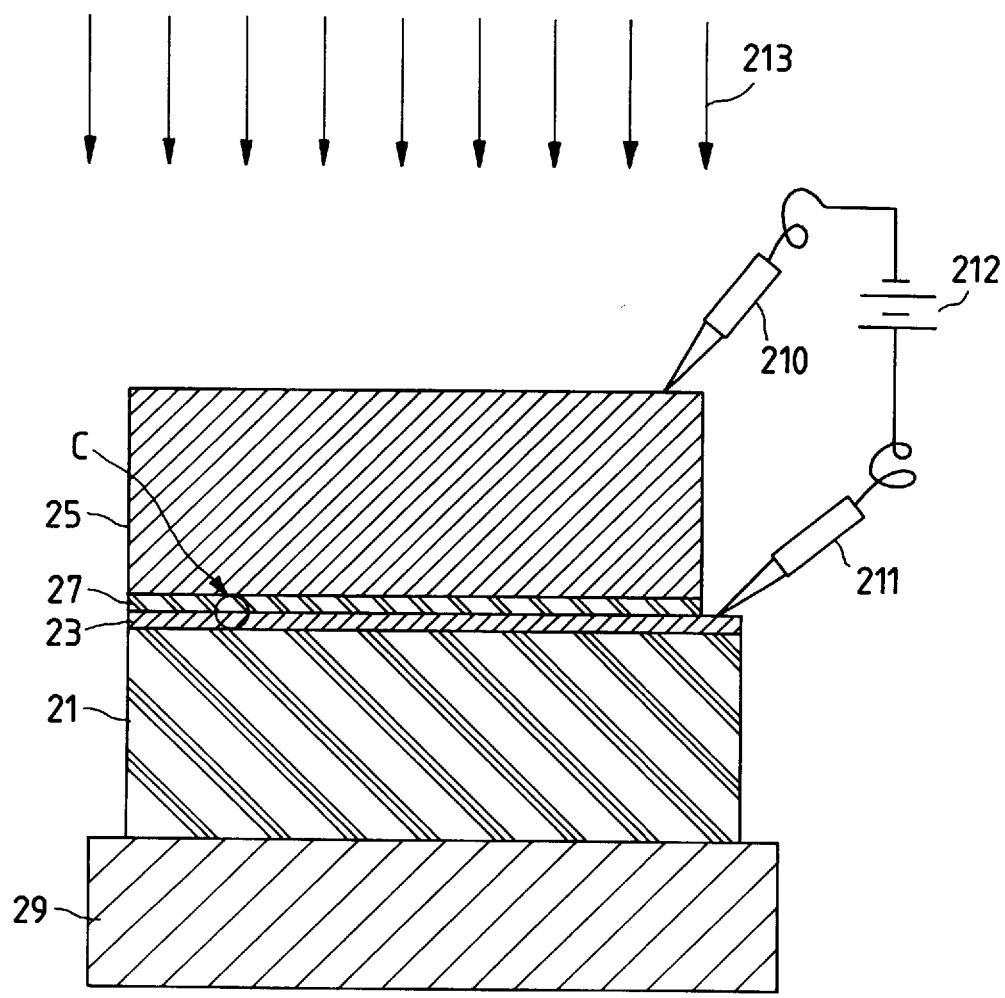
FIG. 14 is a schematic diagram illustrating a method for bonding PZT to a Si substrate.
Figure 15:
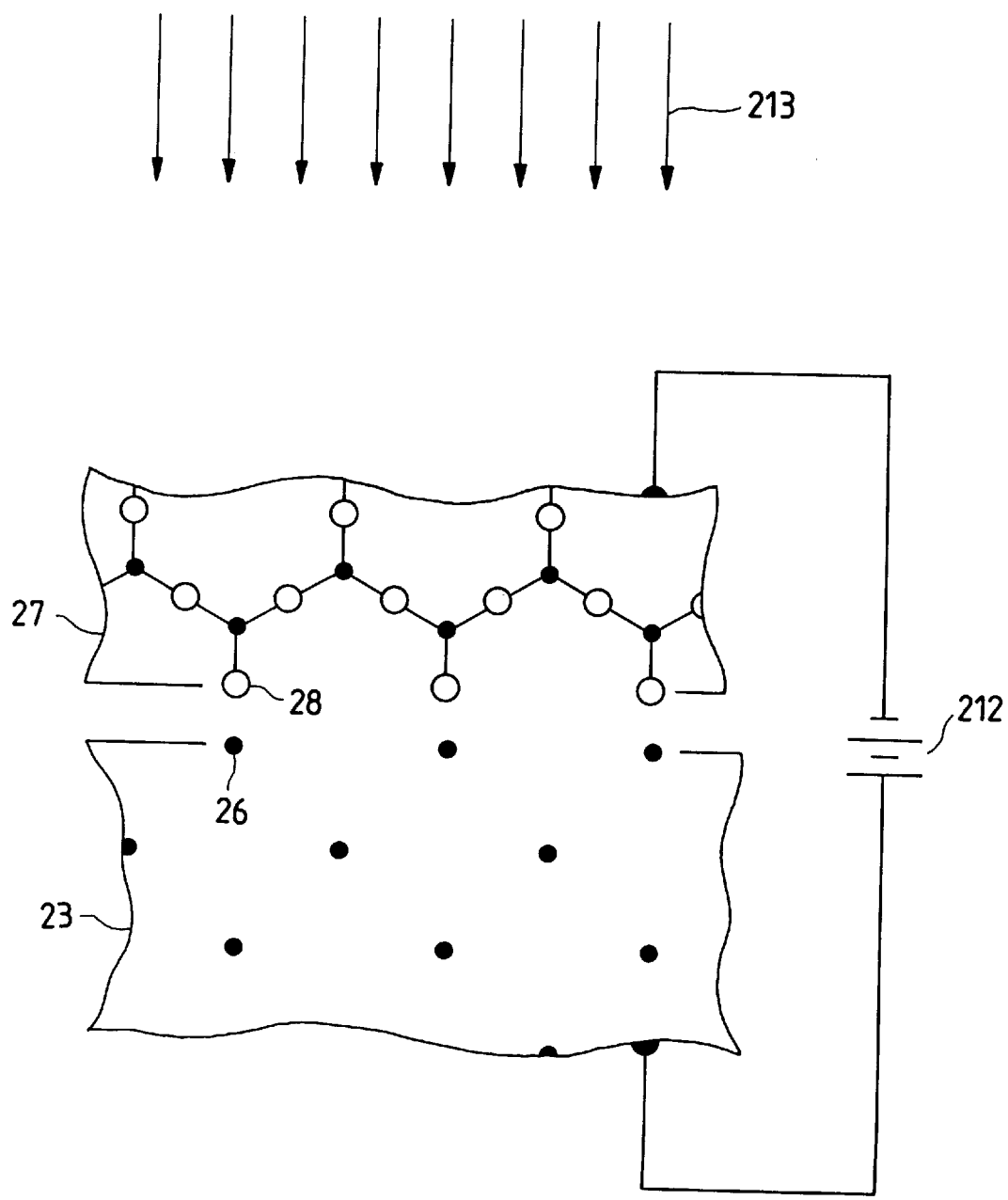
FIG. 15 is a magnified view of the part C shown, in FIG. 14.

After the steps described above, the Si film 23 on the PZT 21 and the Si oxide film 27 on the Si substrate 25 were opposed to each other and joined face to face as shown in FIG. 14 and then a voltage was applied between the Si substrate 25 and the Si film 23 via the needle electrode 210 and the needle electrode 211 to induce generation of electrostatic attraction between the Si film 23 and the Si substrate 25. As a result, the Si film 23 and the Si oxide film 27 were caused to approach each other so that the distance therebetween reached the order of the interatomic distance. When the $CO_2$ laser beam 213 was simultaneously projected on the bonding interface surface for bonding, the Si atoms 26 of the Si film 23 and the oxygen ions 28 of the Si oxide film 27 as shown in FIG. 15 were both excited by this irradiation, the Si atoms 26 and the oxygen ions 28 were rendered easily bondable and were eventually bonded as the distance therebetween approached the order of the interatomic distance. Thus, the bonding of the PZT 21 to the Si substrate 25 was realized.

The bonding in this example was carried out under the following conditions. The thickness of the PZT 21 was 0.5 mm and the thickness of the Si substrate was 0.5 mm.

Then, during the fixation of the Si film 23 to the PZT 21, the voltage applied was 500 V and the intensity of the $CO_2$ laser beam was 5 $W/cm^2$.

During the fixation of the Si oxide film 27 to the Si substrate 25, the voltage applied was 10 to 30 V and the intensity of the $CO_2$ laser beam was 5 $W/cm^2$.

During the bonding of the PZT 21 to the Si substrate 25 as shown in FIG. 14, the voltage applied was 10 to 30 V and the intensity of the $CO_2$ laser beam was 5 $W/cm^2$.

The bonding force manifested between the PZT 21 and the Si substrate 25 which had been bonded by bonding in this example was strong. When a sample 5 mm in width was cut from the produced bonded member and subjected to a bending test, it showed a load at rupture of 2 kg, a magnitude equivalent to the working strength.

The intent of this invention is not changed at all when other materials except those mentioned hereinabove are used for the bonding contemplated herein, as when the conductive film on the insulator substrate uses such other elements than Si as Al, Ti, Zn, Zr, Pb, Cu, Sn, and C whereas strontium titanate oxide and zinc oxide are used for the insulating substrate instead of PZT and, meanwhile, the insulating film on the Si substrate is an Al oxide film, Ti oxide film, Zr oxide film, zinc oxide film, lead oxide film, copper oxide film, tin oxide film, or glass instead of the Si oxide film.

Example 5

Figure 16:
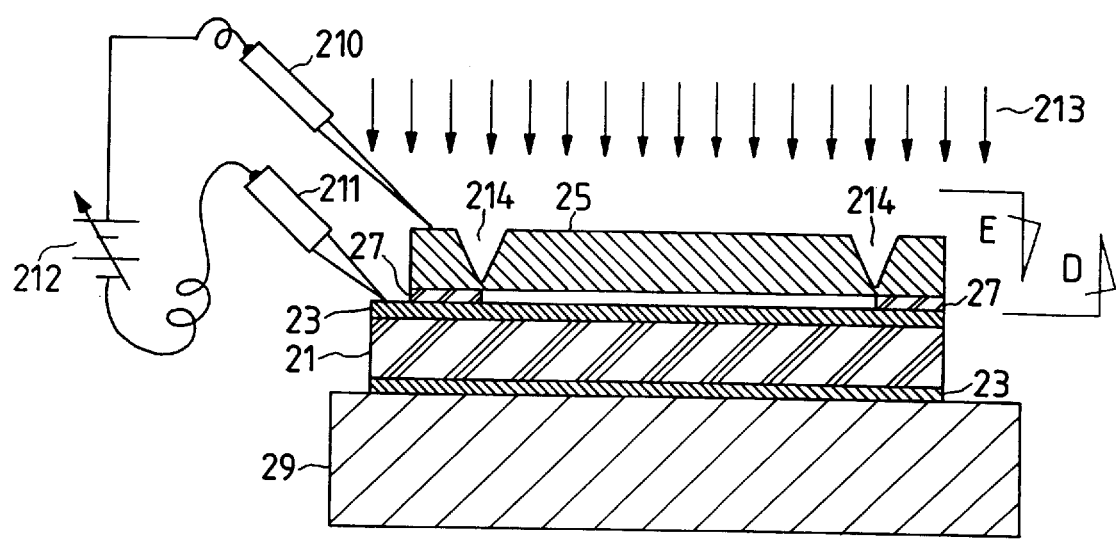
FIG. 16 is a schematic diagram illustrating a method for bonding a Si substrate to a barium titanate oxide substrate.
Figure 17:
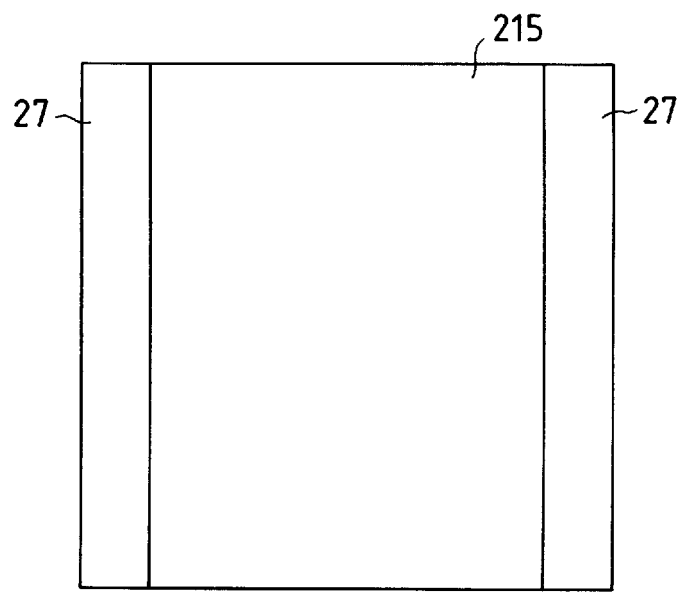
FIG. 17 is a view in the direction of the arrow D in FIG. 16.
Figure 18:
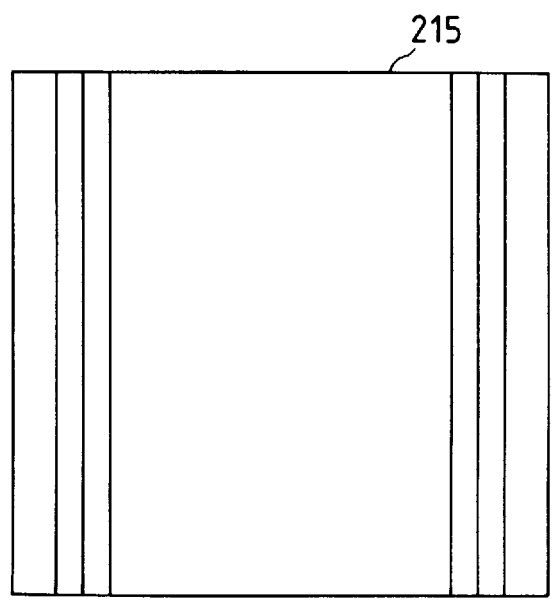
FIG. 18 is a view in the direction of E in FIG. 16.

FIGS. 16, 17, and 18 illustrate a fifth example of this invention; FIG. 16 a diagram depicting the characteristics of this invention to the best advantage. In the diagrams, 21 stands for a film 21 of barium titanate oxide as a piezoelectric material, 23 for a conductive Si film formed on each of the opposite surfaces of the barium titanate oxide film 21, 215 for a Si substrate, 27 for a Si oxide film formed on the Si substrate 25, 29 for a platen of conductive material, 210 and 211 stand for needle electrodes to be used for application of electric field between the materials subjected to bonding, 212 stands for a power source to be used for application of electric field between the materials subjected to bonding, 213 for a $CO_2$ laser beam for projection of light on the surface of adhesion during the bonding by adhesion, and 214 for a V-shaped groove formed near each of the opposite end parts of the Si substrate 215 for having flexibility to the Si substrate 215.

The construction described above is aimed at bonding the barium titanate oxide film 21 to the flexible Si substrate 25, thereby enabling the amplitude of oscillation generated in the barium titanate oxide film 21 as the source of oscillation to be transmitted simultaneously to the Si substrate 25.

To be specific, the force of fixation between the Si substrate 25 and the Si oxide film 27 was by first forming a film of Si wholly on each of the opposite surfaces of the barium titanate oxide film 21, then fortifying the force of fixation between the barium titanate oxide film 21 and the Si film 23 by using the same procedure as described in Example 4 and, in the meantime, forming the V-shaped grooves 214 in the Si substrate 25 by electrolytic etching using KOH, forming the Si oxide films 27 one each near the opposite ends on the surface of the Si substrate 25 opposite to the surface thereof containing the V-shaped grooves 214, and thereafter using the procedure described in Example 4. Then, the Si film 23 and the Si oxide film 27 were opposed to each other and bonded face to face and, at the same time, the barium titanate oxide film 21 and the Si substrate 25 were aligned at the positions shown in FIG. 16, a voltage was applied between the Si substrate 25 and the Si film 23 through the needle electrodes 210 and 211 by the use of the power source 212 and, at the same time, the $CO_2$ lazer beam 213 was projected on the bonding interface from above the Si substrate 25 to bond the barium titanate oxide film 21 and the Si substrate 25 by bonding. The bonding in this example was carried out under the following conditions. The thickness of the Si substrate 215 was 0.5 mm, the thickness of the barium titanate oxide film 21 was 0.5 mm, the voltage applied was 5 to 30 V, the intensity of the $CO_2$ laser beam was 5 $W/cm^2$, and the duration of adhesion was about 10 minutes.

When the barium titanate oxide film 21 was joined by adhesion to the Si substrate 25 in accordance with the method of this example and the barium titanate oxide film 21 was oscillated by applying the AC voltage between the opposite surfaces 23 of the barium titanate oxide film 21, the Si substrate 25 was observed to oscillate at the same oscillation amplitude and frequency as the barium titanate oxide film 21.

The intent of this invention is not changed at all when other light sources are used in the place of the $CO_2$ laser beam as used in this example.

What is claimed is:

1. A method for bonding an insulator formed of a piezoelectric material and a conductor, comprising:

(a) a step of polishing the insulator to impart a flat, smooth surface thereto;

(b) a step of forming a thin conductive film on the flat, smooth surface of the insulator;

(c) the steps of providing an insulating substrate containing ions of sufficient mobility to migrate toward an electrode during anodic bonding, said insulating substrate having first and second opposed faces, and forming a thin conductive film on one portion of the first face of the insulating substrate;

(d) a step of anodically bonding the first face of the insulating substrate to the thin conductive film on the insulator;

(e) a step of subsequently thinning and polishing the second face of the insulating substrate to impart a flat, smooth surface thereto; and (f) a step of anodically bonding the conductor and the flat, smooth polished surface of the second face of the insulating substrate using the thin conductive film formed on said one portion of the first face of the insulating substrate as an electrode.

2. A method for bonding according to claim 1, wherein the first and second thin conductive films are each independently formed of at least one element selected from the group consisting of Si, Al, Ti, Zn, Zr, Pb, Cu, Sn, and C.

3. A method for bonding according to claim 1, wherein the insulating substrate is at least one member selected from the group consisting of Si oxide, Al oxide, Ti oxide, Zr oxide, Zn oxide, Pb oxide, Cu oxide, Sn oxide, and glass.

4. A method for bonding according to claim 1, wherein the piezoelectric material is at least one substance selected from the group consisting of lead zirconate titanate, barium titanate oxide, strontium titanate oxide, and zinc oxide.

5. A method for bonding an insulator formed of a piezoelectric material and a conductor, comprising:
   (a) a step of boring a hole through the insulator;
   (b) a step of polishing the insulator to impart a flat, smooth surface thereto;
   (c) a step of forming a thin conductive film on the flat, smooth surface of the insulator;
   (d) a step of providing an insulating substrate containing ions of sufficient mobility to migrate toward an electrode during anodic bonding, said insulating substrate having first and second opposed faces;
   (e) a step of anodically bonding the first face of the insulating substrate to the thin conductive film on the insulator;
   (f) a step of subsequently thinning and polishing the second face of the insulating substrate to impart a flat, smooth surface thereto;
   (g) a step of forming a thin conductive film in the bored hole of the insulator; and
   (h) a step of anodically bonding the conductor and the flat, smooth polished surface of the second face of the insulating substrate using the thin conductive film formed in the bored hole of the insulator as an electrode.

6. A method for bonding according to claim 5, wherein the anodic bonding of the insulating substrate to the conductor is carried out by using the thin conductive film formed in the bored hole of the insulator as a negative electrode and the conductor as a positive electrode.

7. A method for bonding according to claim 1 or claim 5, wherein the anodic bonding of the insulating substrate to the thin conductive film on the flat, smooth surface of the insulator is carried out by using the thin conductive film on the flat, smooth surface of the insulator as a positive electrode and the insulating substrate as a negative electrode.

8. A method for bonding according to claim 1 or claim 5, wherein the insulating substrate is cut to a desired size and anodically bonded to the conductor.

9. A method according to claim 1 or claim 5, wherein the anodic bonding steps comprise projecting a laser beam on the surfaces being bonded while applying an electric field without using heating means.

10. A method for bonding an insulator formed of a piezoelectric material and a conductor, comprising:
    (a) a step of polishing the insulator to impart a flat, smooth surface thereto;
    (b) a step of forming a thin conductive film on the flat, smooth surface of the insulator;
    (c) the steps of providing an insulating substrate containing ions of sufficient mobility to migrate toward an electrode during anodic bonding, said insulating substrate having first and second opposed faces, and forming a thin conductive film on one portion of the first face of the insulating substrate;
    (d) a step of anodically bonding the first face of the insulating substrate to the thin conductive film on the insulator; and
    (e) a step of anodically bonding the conductor and the second face of the insulating substrate using the thin conductive film formed on said one portion of the first face of the insulating substrate as an electrode.

11. A method for bonding according to claim 10, wherein during at least one of the anodic bonding steps a voltage is applied between the surfaces being bonded and light is simultaneously irradiated thereon.

12. A method for bonding according to claim 10, wherein the first and second thin conductive films are each independently formed of at least one element selected from the group consisting of Si, Al, Ti, Zn, Zr, Pb, Cu, Sn, and C.

13. A method for bonding according to claim 10, wherein the insulating substrate is at least one member selected from the group consisting of Si oxide, Al oxide, Ti oxide, Zr oxide, Zn oxide, Pb oxide, Cu oxide, Sn oxide, and glass.

14. A method for bonding according to claim 10, wherein the piezoelectric material is at least one substance selected from the group consisting of lead zirconate titanate, barium titanate oxide, strontium titanate oxide, and zinc oxide.

15. A method for bonding according to claim 10, wherein at least one of the anodic bonding steps comprises projecting a laser beam on the surfaces being bonded while applying an electric field without applying heat.

16. A method for bonding an insulator formed of a piezoelectric material and a conductor, comprising:
    (a) a step of boring a hole through the insulator;
    (b) a step of polishing the insulator to impart a flat, smooth surface thereto;
    (c) a step of forming a thin conductive film on the flat, smooth surface of the insulator;
    (d) a step of providing an insulating substrate containing ions of sufficient mobility to migrate toward an electrode during anodic bonding, said insulating substrate having first and second opposed faces;
    (e) a step of anodically bonding the first face of the insulating substrate to the thin conductive film on the insulator;
    (f) a step of forming a thin conductive film in the bored hole of the insulator; and
    (g) a step of anodically bonding the conductor and the second face of the insulating substrate using the thin conductive film formed in the bored hole of the insulator as an electrode.

* * * * *